US006888140B2

(12) United States Patent
Hayn (10) Patent No.: US 6,888,140 B2
(45) Date of Patent: May 3, 2005

(54) PARTICLE DETECTORS (75) Inventor: Armin Heinz Hayn, Saffron Walden (GB)

(73) Assignee: Leo Electron Microscopy Limited, Cambridge (GB)

( * ) Notice: Subject to any disclaimer, the term of this patent is extended or adjusted under 35 U.S.C. 154(b) by 83 days.

(21) Appl. No.: 10/449,146

(22) Filed: May 30, 2003

(65) Prior Publication Data

US 2004/0026621 A1 Feb. 12, 2004

(30) Foreign Application Priority Data

May 31, 2002 (GB) ............................................... 0212601
May 31, 2002 (GB) ............................................... 0212629

(51) Int. Cl.$^7$ .......................... H01J 37/244; G21K 1/00
(52) U.S. Cl. .................... 250/311; 250/310; 250/423 F; 250/397; 315/111.91; 313/310
(58) Field of Search .................... 250/310, 311, 250/423 F, 397; 315/111.91; 313/310

(56) References Cited

U.S. PATENT DOCUMENTS 3,766,427 A * 10/1973 Coates et al. ................ 315/382
5,854,490 A * 12/1998 Ooaeh et al. .......... 250/492.23

* cited by examiner

Primary Examiner—Nikita Wells
(74) Attorney, Agent, or Firm—Barnes & Thornburg (57) ABSTRACT

A signal detector for detecting electrically charged particles in a gaseous medium has an electrode having a tip region for gathering charged particles. The electrode is connected to a voltage source for applying a voltage that generates electro-static field for attracting the particles to the electrode, and at least part of the tip region has a radius of curvature which is sufficiently small or (in the case of a point tip or sharp edge) infinitesimally small so as to create a localised high intensity electro-static field which defines a detection zone in which, in use, charge particles are accelerated by the electric field so as to ionise gas molecules in the zone and thus amplify the signal to be received by the detector. The received signal is supplied through an output of the detector. The detector may be provided in a sample chamber of a scanning electron microscope.

21 Claims, 10 Drawing Sheets

Fig. 5 Sheet 2

Fig. 5 Sheet 3

Fig. 6 Sheet 1

Fig. 6 Sheet 2

Fig. 6 Sheet 3

Fig. 7 Sheet 1

Fig. 7 Sheet 2

PARTICLE DETECTORS

FIELD OF THE INVENTION

This invention relates to a signal detector for detecting electrically charged particles in gaseous medium, a sample chamber for holding a sample in such a medium, a scanning beam imaging device, such as an electron microscope and to a method of achieving gas amplification of a secondary electron signal.

BACKGROUND TO THE INVENTION

In early types of electron microscope, the sample to be imaged was contained in a sample chamber in which a vacuum was maintained during the imaging process. However, there are occasions on which it is necessary or desirable to image specimens in a gaseous environment in a scanning electron microscope. For example the gaseous environment would inhibit the evaporation of moisture from a biological specimen, and can dissipate surface charges from non-conductive specimens, which charges would otherwise accumulate to the detriment of image resolution.

The use of a gaseous environment amplify a secondary electron signal obtained during imaging of the specimen is described in U.S. Pat. No. 4,785,182 (Mancuso et al.) and European Patent No. EP 330310 (Electroscan Corp). In both arrangements, secondary electrons were released from a specimen as a result of interactions with a scanning electron beam, and aerated through the gaseous environment in the sample chamber. The resulting collisions of the secondary electron with the gas molecules of the environment ionised the molecules, and thus released further electrons which were also accelerated so as to give rise to further collisions and the release of yet further electrons. Thus the secondary electrons emanating from the sample gave rise to an avalanche of electrons released by the ionisation of the gas molecules. Thus the gaseous environment, in effect, provides amplification of the secondary electrons.

However, the received secondary electron signal may include interference as the result of the interaction of backscattered electrons with the gaseous medium, as the backscattered electrons can also cause the gas medium to release an avalanche of electrons.

As the pressure of gas in the chamber is increased, the mean free path of the secondary electrons directly released from the sample decreases to the extent that many secondary electrons collide with molecules at velocities sufficient to cause the necessary ionisation for gas amplification to recur. Backscattered electrons however, have a larger mean free path than secondary electrons and will therefore make a greater contribution to the output signal at high gas pressures. U.S. Pat. No. 5,412,211 (Electronscan Corporation) and European Patent No. EP 0753200 (Phillips Electronics North America Corporation) describe the use of a biased pressure limiting aperture to reduce the backscattered contribution to the detected signal. However, this approach relies on rile backscattered electrons not travelling tough the same part of the sample chamber as the secondary electrons to be detected, an assumption which does not always bold.

SUMMARY OF THE INVENTION

According to the invention, there is provided a signal detector for detecting electrically charged particles in a gaseous medium, the detector comprising an electrode having a tip region for gathering the charged particles; connector means for connecting the electrode to voltage application means for applying to the electrode a voltage for generating an electrostatic field for attracting the particles; an output means for providing an output representative of the number of particles detected, wherein at least part of the tip region has a radius of curvature sufficiently small to create, in use, a localised high intensity electro static field which defines a detection zone in which, in use, charged particles are accelerated by the electric field to an extent sufficient to ionise gas molecules in the zone and thus amplify the signal to be received by the detector.

Preferably, the output means is electrically connected to the electrode, so that the detector output is related to the number of charged particles impacting on the electrode.

Preferably, the detector includes an electronic amplifier for further amplifying the output signal. The detector preferably also includes said voltage application means.

Because the detection zone is localised, the detector can be positioned in such a way as to detect only particles having a mean free path similar to the distance between the detector and a sample. Thus, if secondary electrons are to be detected in an electron microscope, the detector may be so positioned that secondary electrons travelling from the sample into the zone are likely to collide with gaseous atoms in the zone, thereby generating a cascade of collisions. However, backscattered electrons either do not enter the zone or, if they do travel straight through the zone without making any such collisions, by virtue of the larger mean free path of such electrons.

The electrode may comprise a cylinder in which case said part of the tip region is constituted by the edge between the cylindrical side(s) and the end of the cylinder. In the case of a circularly symmetric cylinder, for example, the part is constituted by the circular edge of the end face. Alternatively, the electrode may comprise a needle tapered to a point, the point constituting said part of the tip region.

Since an edge or point of a surface can be considered to be discontinuities in a surface, it will be appreciated that the said part of the tip region of the electrode may have an infinitesimally small radius of curvature.

Preferably, the surface area of the tip is less than 0.79 mm$^2$. Preferably, the surface area of the tip is 0.03 mm$^2$.

Where the electrode is circularly cylindrical, it is preferably of a diameter of not more than 1 mm and more preferably of a diameter of 200 $\mu$m.

Where the detector includes an amplifier, the amplifier and electrode are preferably mounted on a common circuit board.

Conveniently, the electrode comprises a piece of wire.

The selectivity of the detector can be further improved by ensuring that the length of exposed electrode is as short as possible, so that the number of particles incident on part of the electrode other than the tip is minimised.

To that end, the electrode is preferably of a length of 0.5 to 50 mm.

The electrode may to advantage be protected by a shield, beyond which the tip region of the electrode extends, the shield preventing particle impacts on the part of the detector other than the exposed tip from interfering with the detector's output.

Preferably, the length of the exposed portion of the electrode (i.e. the portion protruding beyond the shield) is less than one millimetre.

Preferably, the shield is non-conducting (although a conductive shield electrically isolated from the electrode may be used).

The detector is preferably operable to detect secondary electrons released from a specimen in the chamber of an electron microscope.

According to a second aspect of the invention, there is provided a sample chamber for a particle beam device, for example an electron microscope, the chamber having means for holding a sole in a gaseous atmosphere, and a signal detector in accordance with the first aspect of the invention.

Preferably, the chamber includes means for receiving a particle beam source so that, in use, the beam travels along a predetermined beam axis, a sample, in use, being held in a position on said axis. In such a case, the detector is preferably so positioned that the electrode tip region is 500 $\mu$m to 1 mm from the beam axis.

The detector may to advantage be one of a plurality of such detectors which are angularly spaced from another about the beam axis. This can be used to improve the directionality of the detected signal as well as the signal noise ratio.

Where the detecting means includes electronic amplification means, this is preferably provided on a printed circuit board on which the electrode is mounted, both electrode and circuit board being situated in the chamber.

It has been found that this feature improves the bandwidth of the detector. The bandwidth of a detector is limited by stray capacitance. Any electronic components, surfaces and wires have a capacitance. Fast frequencies are led away via these 'stray capacitors' and therefore not amplified which makes the image captured using the detector appear smeared. An increased length of wire increases its capacitance yielding a lower bandwidth. Therefore locating PCB as close to the electrode as possible reduces stray capacitance, and thus increases bandwidth.

The invention also lies in a scanning beam device, such as an electron microscope, having beam generating means for scanning beam of charged particles, and a chamber in accordance with the second aspect of the invention.

According to a further aspect in the invention, there is a provided a method of amplifying a secondary electron signal in an electron microscope having a chamber for holding a sample in a gaseous medium and a detector in accordance with the first aspect to the invention, the method comprising the steps of applying to the electrode a voltage sufficient to cause electrons which collide with gas atoms in a collision zone about the electrode tip to release further electrons as the result of those collisions, and thus to achieve gas amplification of any received signal attributable to those electrons, wherein the electrode is so positioned that said zone is at a distance from the sample of not less than mean free path of the secondary electrons, but less than the mean free path of backscattered electrons, emanating from the sample.

BRIEF DESCRIPTION OF THE DRAWINGS

The invention will now be described, by way of example only, with reference to the accompanying drawings in which.

DETAILED DESCRIPTION

Figure 1:
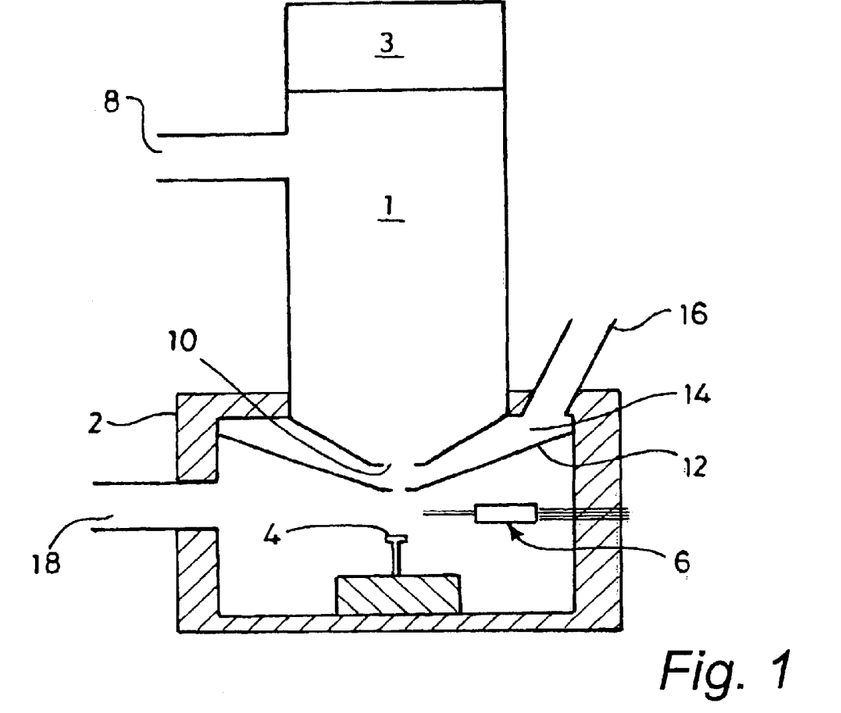
FIG. 1 is a schematic side elevation of an electron microscope in accordance with the invention.

With reference to FIG. 1, an electron microscope in accordance with the invention comprises an electron column 1 mounted on a sample chamber 2 which contains a platform support 4 for a specimen in registry with the column 1. The chamber also contains a secondary electron detector 6 for detesting secondary electrons emanating from a sample on the platform 4. At the top of the column 1 there is provided an electron gun 3 for providing electrons for the column 1.

The gun 3 and electron column 1 are identical to the gun and electron column of the electron microscope described in PCT Publication No. WO 98/22971, the relevant subject matter of which is therefore incorporated herein by reference.

Thus, the column 1 includes a vacuum port 8 connected to a pump (not shown) for maintaining a vacuum in the column 1.

The top of the chamber 2 has an opening through which the bottom portion of the column 1 extends. The column 1 is a tight fit within the opening in the chamber 2, and the apparatus includes seals (not shown) hermetically sealing the periphery of the column to the chamber 2 at the opening. The scanning electron beam generated by the column 1 passes through an orifice 10 in the bottom of the column 1.

The chamber 2 is internally partitioned by a frusto conical dividing wall 12 positioned beneath the bottom portion of the column 1, but above the sample holder 4 and the detector 6. The bottom portion of the column 1, the roof of the chamber 2 and the wall 12 between them define an intermediate pumping chamber 14 which communicates with a further vacuum port 16. The port 16 is connected to another vacuum pump which maintains the pressure of as in the intermediate chamber 14 at a level greater than the near total vacuum in the column 1 but lower than the pressure of gas in the rest of the chamber 2.

The chamber 2 includes a her outlet port 18 which opens onto the chamber 2 at a region below the wall 12, and hence outside the intermediate chamber 14. The port 18 is connected to another pump (not shown) for controlling the pressure of gas in the volume in the chamber 2 which includes the sample holder 4 and the detector 6.

Figure 2:
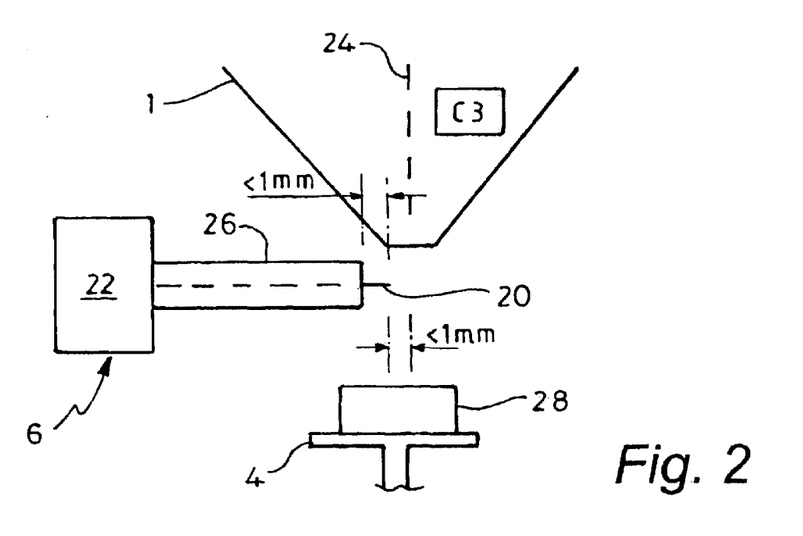
FIG. 2 is a more detailed view of part of the electron microscope, when viewed from the opposite direction to that of FIG. 1.

The structure of the detector can be more clearly seen from FIG. 2, in which the chamber 2, wall 12 and part of the support means 4 have been omitted for the sake of clarity.

The detector 6 comprises a circularly cylindrical, metal needle 20 (with a length of about 20 mm and a diameter of 120 $\mu$m) which is mounted on a printed circuit board 22 and extends horizontally from the printed circuit board 22 to a position in which the tip of the needle 20 is positioned less than 1 mm (preferably 0.5 mm) away from the beam axis, indicated at 24, of the column 1. A shield in the form of a cylindrical sleeve 26 of a non-conducting material surrounds and shields the whole of the needle 20 apart from its exposed tip. Thus the shield extends from the printed circuit board, in the same direction and the needle 20 to a distance 5 mm short of the very tip of the needle 20, so that only about 0.5 mm of the needle is exposed. In use, any electrons or other particle impacting on the shield 26 will be prevented from contributing to the protected signal.

The printed circuit board 22 includes an electronic pre-amplifier connected to the needle 20 and electronic circuitry for applying to the needle 20 a controlled voltage (of positive polarity). The amplifier and circuitry are described below with reference to FIGS. 5 to 7.

If low voltages of up to about 50 volts are applied to the needle, secondary electrons from the sample (28 in FIG. 2) are accelerated towards the needle tip without causing any amplification, as the electric field further away from the needle is very small. As soon as the released electrons approach the needle tip, the electric field is strong enough to create an amplification of the secondary electron signal, of the order of 2 to 10, as the result of ionising collisions in the detection zone about the tip. As the amplification takes place very close to the needle tip, an increased secondary electron sign can be observed due to an induced field effect.

When using high biases, of up to 400 volts for example, the secondary electrons leaving the sample 12 are accelerated towards the needle tip with weak amplification until they approach the needle tip. A very high amplification then takes place as the high electric field near the tip causes a cascade resulting in high gain amplification of the order of 100 up to 1000.

However, the tip of the needle 20 is situated so close to the sample 28 that any backscattered electrons travelling through the amplification zone are unlikely to collide with any gas atoms in that zone, so that the detector 6 preferentially amplifies the secondary electron signal.

The distance between the needle tip and the optical axis (i.e. the beam axis 24) is only about 0.5 mm because a larger distance will reduce the electric field on the sample, and will not attract enough secondary electrons. However, it has been found that the distance of 0.5 mm to 1 mm between the tip and the axis can provide satisfactory results for secondary electron signals in pressures of up to 1500 Pa.

Figure 3:
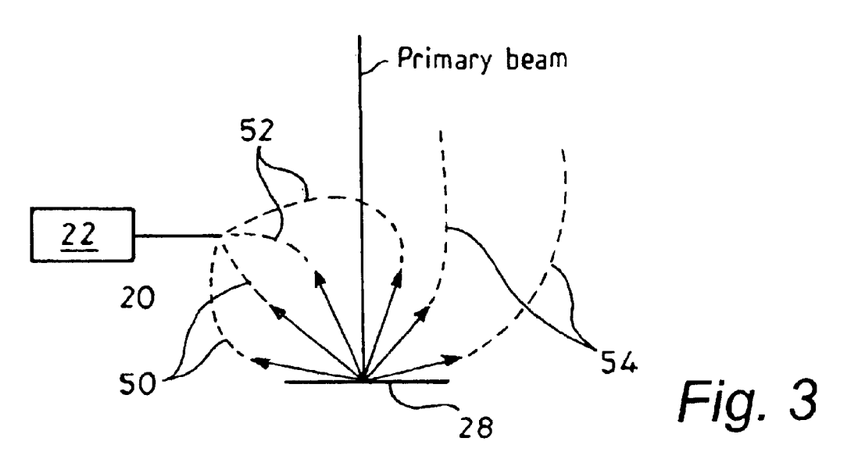
FIG. 3 illustrates how the arrangement of FIGS. 1 and 2 can give rise to directionality in a detected secondary electron signal.

Due to the relatively weak electric field in the parts of the chamber not close to the needle tip the needle 20 might not collect some of the secondary electrons released from the sample. This effect is illustrated in FIG. 3, in which secondary electrons travelling along any of the paths 50 and 52 are collected whereas electrons travelling along either of the paths 54 are not.

Figure 4:
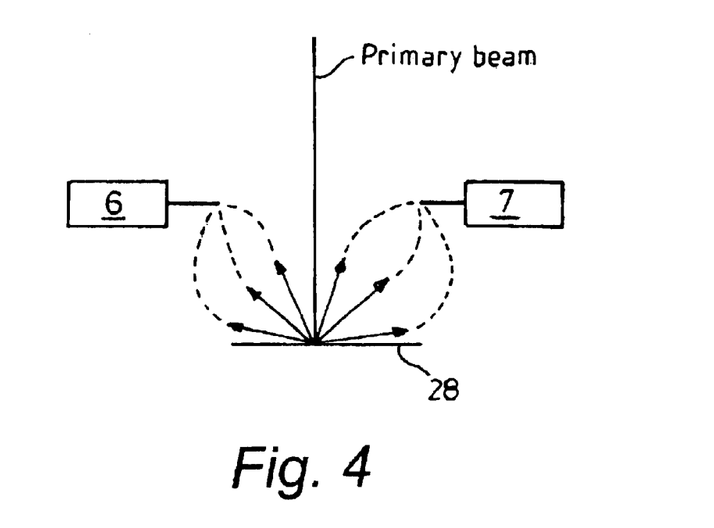
FIG. 4 shows the arrangement of detectors in a modified version of the microscope, which mitigates or overcomes the problem of directionality.

FIG. 4 shows an arrangement in which the detector 6 is one of two such detectors, the other being referenced 7. The two detectors are equidistant from the beam and are diametrically opposed to each other so that the detector 7 collects at least some of the secondary electrons which are missed by the detector 6. Another embodiment of microscope according to the invention can have a second pair of detectors, identical to detectors 6 and 7, which are so arranged that the four detectors are equiangularly spaced about the microscope's primary beam.

Figure 5:
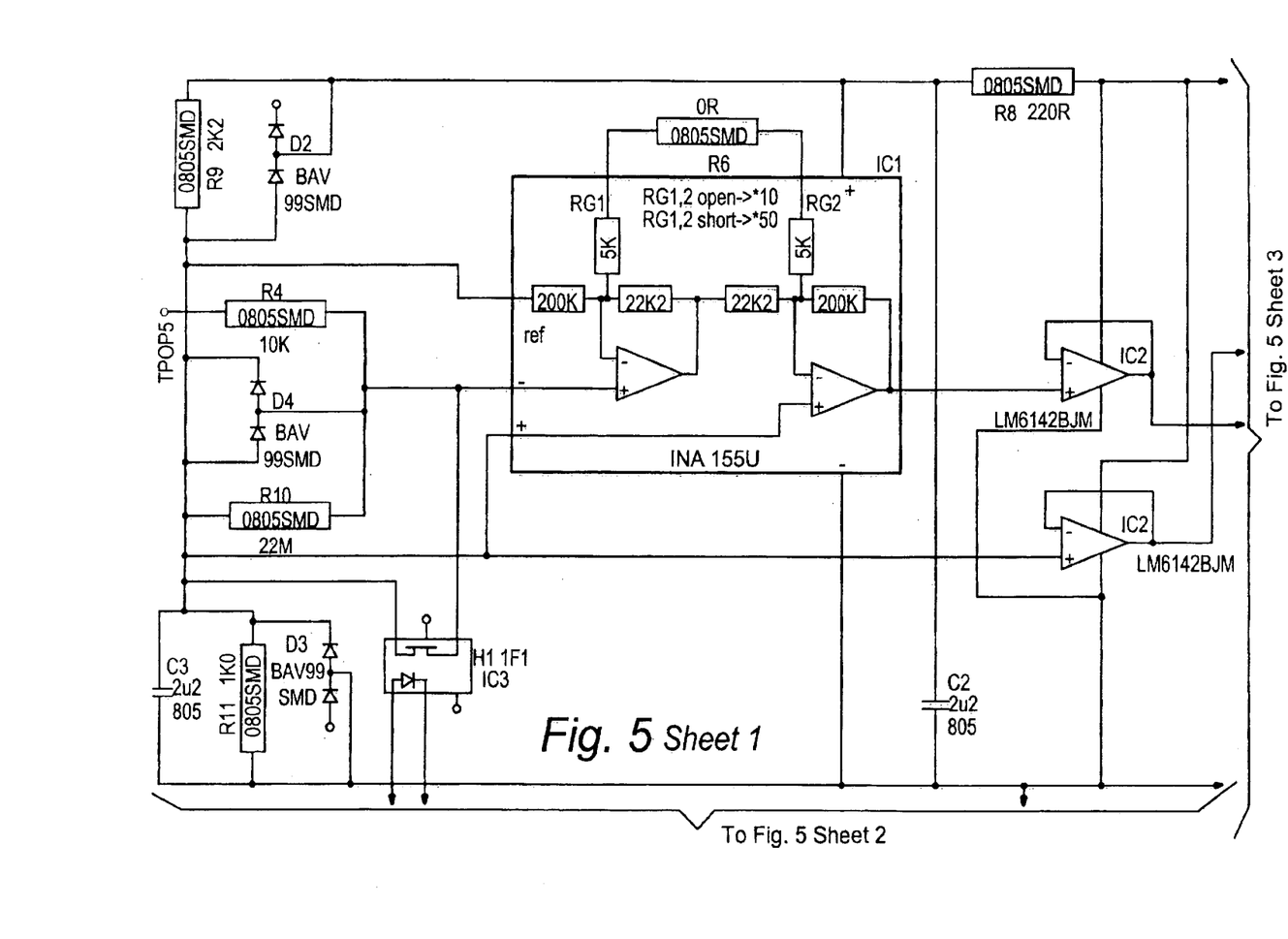
FIG. 5 is a circuit diagram of am amplifier forming part of the detector, and which includes a first transresistance amplifier.

The amplifier of FIG. 5 comprises four stages, a transresistance amplifier, a buffer amplifier, a transconductance amplifier and a photo BJT opto-coupler.

In use power is supplied to the amplifier from a floating 5 volt power supply, the positive terminal being indicated in FIG. 5 by TP5 and the negative terminal by TP9. A first low-pass filter is formed by resistor R22 and capacitor C5, and a second low-pass filter by resistor R8 and capacitor C2. The first and second low-pass filters smooth the power supply voltage. Resistors R9 and R11 form a potential divider that establishes a reference voltage for both the transresistance amplifier and transconductance amplifier. Capacitor C3 smoothes the reference voltage.

The 5 volt power supply for the amplifier floats on a 40 volt power supply. A positive terminal of the 40 volt power supply is indicated by TP10 in FIG. 1 and is used to establish an electric field in the vicinity of the electrode 20 in the specimen chamber 2 such that electrons are attracted towards the electrode 20. A negative terminal of the 40 volt power supply is indicated by TP1 and is connected to the chamber (not shown) of the electron microscope (not shown), and to ground.

Capacitor C10 provides a low impedance path to ground for high frequency noise at the negative terminal of the 5 volt power supply. Resistor R1 ties the negative terminal of the 5 volt power supply to the positive terminal of the 40 volt power supply.

The transresistance amplifier is made up of current limiting resistor R4, input resistor R10, photo FET opto-coupler IC3, voltage amplifier IC1, current limiting resistor R7 and capacitors C6 and C7. The operation of the transresistance amplifier is as follows.

The electrode 20 is also connected the input TPOP5, so that electrons incident upon the electrode electrically connected to the input TPOP5 flow through the current limiting resistor R4, then through the parallel arrangement of the input resistor R10 and channel of the photo FET of the opto-coupler IC3 to the junction of resistors R9 and R11, at which the reference voltage is established. This corresponds to a flow of conventional current of picoamp order from the junction of the resistors R9 and R11 to the electrode. The voltage amplifier IC1 has differential inputs, one of which is connected to the junction of the resistors R9 and R11, and the other to the more negative terminals of the input resistor R10 and channel of the photo FET of the opto-coupler IC3. The more positive terminals of the input resistor and channel of the photo PET are connected to the junction of the resistors R9 and R11. Thus the voltage developed across the parallel arrangement of the input resistor R10 and channel of the photo FET is applied to the differential inputs of the voltage amplifier IC1.

The resistance of the channel of the photo FET of the opto-coupler IC3 is determined by the intensity of illumination of the LED of the opto coupler IC3, which itself is determined by the current flowing through the LED. Control of the current through the LED is by means of a control circuit that is described below in relation to FIG. 7.

The current limiting resistor R7 prevents damage to the LED of the opto-coupler IC3 in the event of the input to the LED circuit, indicated by TP6, being inadvertently short-circuited to the positive terminal of either power supply. Capacitors C7 and C6 attenuate noise coupled into the circuit containing the LED of the opto-coupler IC3.

The current limiting resistor R4 limits the current that can be drawn from the 5 volt power supply in the event of the electrode becoming short circuited to the grounded chamber of the electron microscope. In the event of such a short-circuit the lower of the two diodes designated in FIG. 5 by D4 goes into conduction, preventing the differential input to the transresistance amplifier from exceeding one forward diode voltage drop. In the event of a short-circuit between the positive terminal of the 40 volt power supply and tie electrode, the upper of the two diodes designated in FIG. 5 by D4 goes into conduction, again so as to prevent the differential input to the transresistance amplifier from exceeding one forward diode voltage drop. In the event of either such short-circuit the diode D3 prevents the reference voltage from dropping more than one forward diode voltage drop below the negative terminal of the power supply, and the diode D2 prevents the reference voltage from rising more than one forward diode voltage drop above the positive terminal of the power supply.

The buffer amplifier is made up of two unity gain operational amplifiers, both of which are designated IC2 in FIG. 5 because they are formed as a single integrated circuit to improve their thermal tracking. The upper operational amplifier buffers the output voltage from the transresistance amplifier, and the lower operational amplifier buffers the reference voltage.

The purpose of buffering of the output and reference voltages is explained below in relation to the transconductance amplifier.

The transconductance amplifier is made up of first and second operational amplifiers, both of which are designated IC6 in FIG. 5 because they are formed as a single integrated circuit, a first biasing network comprising resistors R20, R23, and R5 together with smoothing capacitor C9, a second biasing network comprising resistors R12, R19, and R15 together with smoothing capacitor C1, first and second feedback resistors R2 and R16 respectively, and load resistor R14.

The first biasing network forms a potential divider between the buffered reference voltage and the negative terminal of the 5 volt power supply, the voltage developed across resistors R20 and R23 being applied to the inverting input of the upper operational amplifier. The second biasing network forms a potential divider between the output of the first low-pass filter and the buffered output voltage from the transresistance amplifier, the voltage developed across resistor R15 being applied to the non-inverting input of the upper operational amplifier.

The buffering of the output and reference voltages by the buffer amplifier ensures that the bias voltages applied to the upper operational amplifier of the transconductance amplifier by the first and second biasing networks are not affected by the output and reference voltages.

The output voltage of the upper operational amplifier is applied to a first terminal of the load resistor R14 so as to produce the output current of the transconductance amplifier. A second terminal of the load resistor R14 is connected to the non-inverting input of the lower operational amplifier IC6. The lower operational amplifier buffers the voltage at the second terminal of the load resistor R14, so as to ensure that the bias voltage at the non-inverting input of the upper operational amplifier is not affected by the voltage developed across the load resistor R14.

The LED of the photo BJT opto-coupler IC4 receives the output current of the transconductance amplifier via the current limiting resistor R3, which serves the same purpose as the current limiting resistor R7. A current of magnitude equal to that which flows through the LED flows through the photo BJT of the opto-coupler IC4. The photo BJT opto-coupler IC4 is used because of its unity current gain. The current flowing through the photo BJT flows through an input resistance (not shown) across which a voltage is developed for application to the input of a video amplifier (not shown).

The current gain of the opto-coupler IC4 is not unity when the current through the LED is zero. For this reason the bias voltages are applied to the inputs of the upper operational amplifier of the transconductance amplifier, so that even when no signal is present at the input to the transresistance amplifier, there is nevertheless an output current from the transconductance amplifier, resulting in an output voltage at the input to the video amplifier that sets the "black" or no signal level, and thereby preserves the unity current gain of the opto-coupler over the signal range in which it is used.

Figure 6:
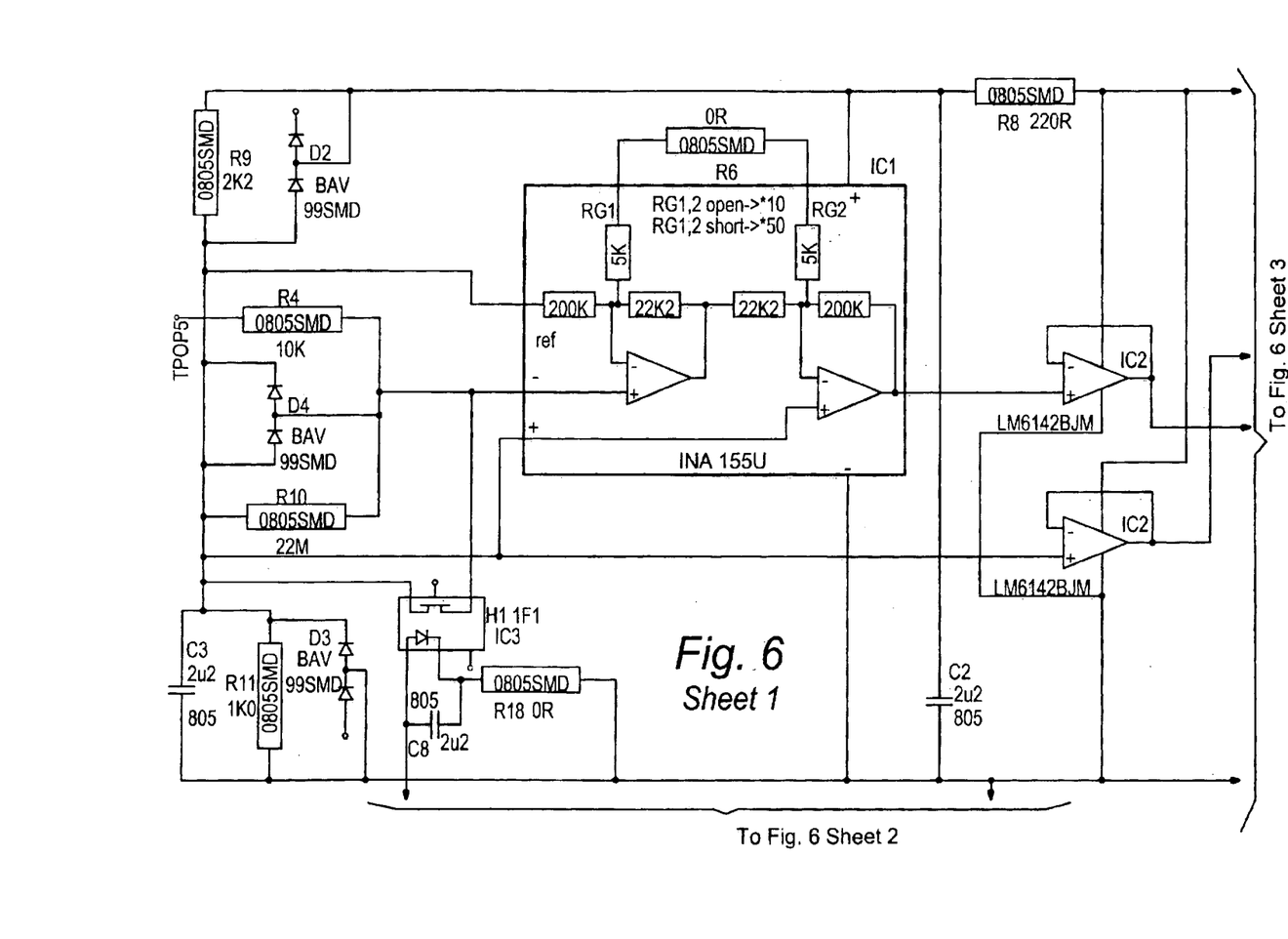
FIG. 6 is a circuit diagram of the amplifier of FIG. 5 in which the first transresistance amplifier has been replaced by a second transresistance amplifier.

Turning next to the amplifier of FIG. 6, this also comprises a transresistance amplifier, a buffer amplifier, a transconductance amplifier and a photo BJT opto-coupler. The buffer amplifier, transconductance amplifier and photo BJT opto-coupler are identical with those of the amplifier of FIG. 1.

However, the transresistance amplifier shown in FIG. 6 comprises, in addition to those elements that make up the transresistance amplifier shown in FIG. 5, a photo BJT opto-coupler IC5 and a capacitor C8.

The photo BJT of the opto-coupler IC5 is connected between the positive terminal of the 5 volt power supply and the anode of the LED of the opto-coupler IC3. The cathode of the LED of the opto-coupler IC3 is connected to the negative terminal of the 5 volt power supply. The capacitor C8 is connected between the junction of the photo BJT of the opto-coupler IC5 and the anode of the LED of the opto-coupler IC3, and the negative terminal of the 5 volt power supply.

A control current applied to the input TP6 to the circuit containing the LED of the opto-coupler IC5 causes a current of equal magnitude to flow through the photo BJT of opto-coupler IC5 and LED of opto-coupler IC3, which current controls the resistance of the channel of the photo FET of opto-coupler IC3, as previously described.

However, high frequency noise coupled into the circuit containing the LED of opto-coupler IC5 (which in the amplifier of FIG. 5 would have been coupled into the circuit containing the LED of opto-coupler IC3) are considerably attenuated, because the minute capacitance between the LED and photo BJT of opto-coupler IC5 and the capacitor C8 form a potential divider which prevents most of the high frequency noise from reaching the LED of the opto-coupler IC3.

Figure 7:
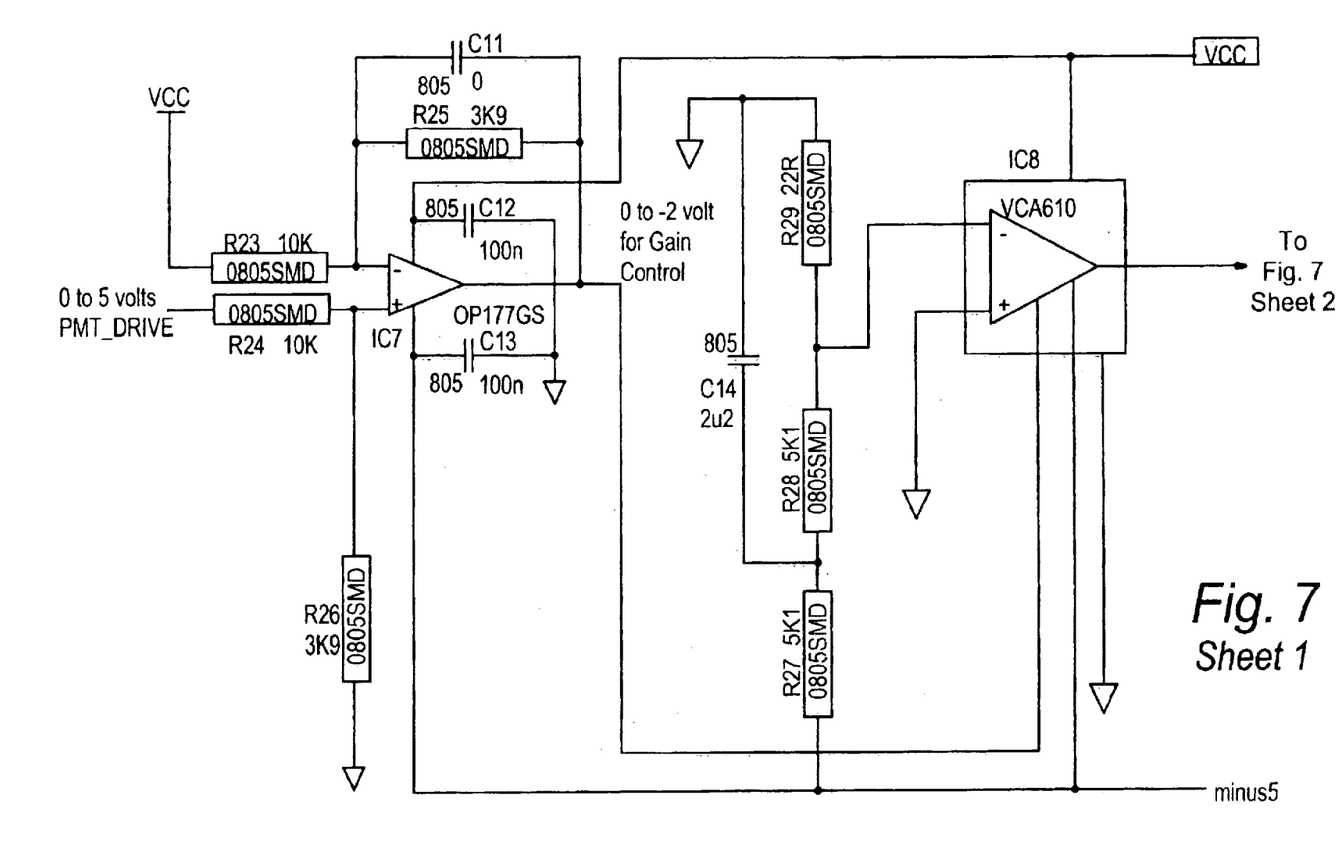
FIG. 7 is a circuit diagram of a control circuit for use in conjunction with the amplifiers of FIGS. 5 and 6.

Turning finally to FIG. 7, the control circuit comprises a digital-to-analogue converter (DAC) (not shown in FIG. 3), a voltage amplifier, a logarithmic amplifier and a transconductance amplifier. The control circuit is supplied by −5 and +5 volt power supplies.

The voltage amplifier is made up of operational amplifier IC7, first biasing network comprising resistors R23 and R25, and second biasing network comprising resistors R24 and R26. Capacitor C11 smoothes the bias voltage at the inverting input of the operational amplifier IC7, and capacitors C12 and C13 smooth the power supply voltages.

The logarithmic amplifier is made up of a logarithmic amplifier integrated circuit (IC) IC8 and a biasing network comprising resistors R27, R28 and R29. Capacitor C14 smoothes the bias voltage at the inverting input of the logarithmic amplifier IC IC8.

The transconductance amplifier comprises an operational amplifier IC9, first biasing network comprising resistors R30 and R32, second biasing network comprising resistors R31 and R33, and load resistor R34. Capacitor C15 smoothes the bias voltage at the inverting input of the operational amplifier IC9, and capacitors C16 and C17 smooth the power supply voltages.

The DAC supplies a 0 to 5 volt control voltage to the non-inverting input of the operational amplifier IC7 of the voltage amplifier. The operational amplifier generates a 0 to −2 volt output voltage proportional to the control voltage.

The logarithmic amplifier has a bias voltage of −10 millivolts applied to its inverting input by the biasing network comprising resistors R27, R28 and R29, and the non-inverting input is connected to ground. The output of the voltage amplifier is connected to a control voltage input of the logarithmic amplifier IC IC8, which produces an output voltage logarithmically related to the control voltage.

The output voltage from the logarithmic amplifier IC IC8 is connected to the inverting input of the transconductance amplifier, which produces an output current through the load resistor R34 that is logarithmically related to the control voltage.

The load resistor is connected to the cathode of the LED of the opto-coupler IC5 of the amplifier of FIG. 6, or to the cathode of the LED of the opto-coupler IC3 of the amplifier of FIG. 5, via TP3. The anode of the LED in each case is connected to ground via TP6.

What is claimed is:

1. A signal detector for detecting electrically charged particles in a gaseous medium, the detector comprising an electrode having a tip region for gathering the charged particles; a connector for connecting the electrode to a voltage source for applying to the electrode a voltage for generating an electrostatic field for attracting the particles; an output for providing an output representative of the number of particles detected, wherein at least part of the tip region has a radius of curvature sufficiently small to create, in use, a localised high intensity electrode static field which defines a detection zone in which, in use, charged particles are accelerated by the electric field to an extent sufficient to ionise gas molecules in the zone and thus amplify the signal to be received by the detector.

2. A detector according to claim 1, in which, the output is electrically connected to the electrode, so that the detector output is related to the number of charged particles impacting on the electrode.

3. A detector according to claim 2, in which the detector includes an electronic amplifier for further amplifying the output signal. The detector preferably also includes said voltage application means.

4. A detector according to claim 3, in which the detector also includes said voltage source.

5. A detector according to claim 3, in which the amplifier and electrode are mounted on a common circuit board.

6. A detector according to claim 1, in which said part of the tip region of the electrode is constituted by a surface discontinuity on the electrode, having infinitesimally small radius of curvature.

7. A detector according to claim 1, in which the surface area of the tip of the electrode is less than 0.79 mm$^2$.

8. A detector according to claim 7, in which the surface area of the top is 0.03 mm$^2$.

9. A detector according to claim 1 in which the electrode is in the shape of a circuit section cyclinder of diameter not more than 1 mm.

10. A detector according to claim 9, in which the cylinder diameter is 200 $\mu$m.

11. A detector according claim 1 in which the electrode comprises a piece of wire.

12. A detector according to claim 1, in which the electrode is of a length of 0.5 to 50 mm.

13. A detector according to claim 1, in which the electrode is protected by a shield, beyond which the tip region of the electrode extends, the shield preventing particle impacts on the part of the detector other than the exposed tip from interfering with the detector's output.

14. A detector according to claim 13, in which the length of the exposed portion of the electrode, protruding beyond the shield, is less than one millimetre.

15. A detector according to claim 13, in which the shield is electrically non-conductive.

16. A detector according to claim 13, in which the detector operable to detect secondary electrons released from a specimen in the chamber of an electron microscope.

17. A sample chamber for a particle beam device, the chamber having means or holding a sample in a gaseous atmosphere, and a signal detector in accordance with claim 1.

18. A sample chamber according to claim 17, in which the chamber includes means for receiving a particle beam source so that, in use, the beam travels along a predetermined beam axis, a sample, in use, being held in a position on said axis, the detector is being so positioned that the electrode tip region is 500 $\mu$m to 1 mm from the beam axis.

19. A sample chamber according to claim 18, in which is one of a plurality of such detectors which are angularly spaced from another about the beam axis.

20. A sample chamber according to claim 17, in which the detecting means includes an electronic amplifier which is provided on a printed circuit board on which the electrode is mounted, both electrode and circuit board being situated in the chamber.

21. A scanning beam device, such as an electron microscope, having beam generating means for scanning beam of charged particles, and a chamber in accordance with claim 17.

* * * * *